(12) United States Patent
Yan et al.

(10) Patent No.: US 9,084,346 B2
(45) Date of Patent: Jul. 14, 2015

(54) POWER ELECTRONIC DEVICE, POWER ELECTRONIC SYSTEM AND HOT PLUG METHOD FOR POWER UNIT

(71) Applicant: DELTA ELECTRONICS, INC., Taoyuan Hsien (TW)

(72) Inventors: Kaitian Yan, Taoyuan Hsien (TW); Shaohua Chen, Taoyuan Hsien (TW)

(73) Assignee: DELTA ELECTRONICS, INC. (TW)

( * ) Notice: Subject to any disclaimer, the term of this patent is extended or adjusted under 35 U.S.C. 154(b) by 249 days.

(21) Appl. No.: 13/846,775

(22) Filed: Mar. 18, 2013

(65) Prior Publication Data
US 2014/0085782 A1    Mar. 27, 2014

(30) Foreign Application Priority Data
Sep. 26, 2012   (CN) .......................... 2012 1 0364745

(51) Int. Cl.
| H05K 5/00 | (2006.01) |
| H05K 7/16 | (2006.01) |
| H02B 1/00 | (2006.01) |
| H05K 5/02 | (2006.01) |
| H05K 7/14 | (2006.01) |

(52) U.S. Cl.
CPC ............ *H05K 5/0217* (2013.01); *H05K 5/0247* (2013.01); *H05K 7/1432* (2013.01); *Y10T 29/49117* (2015.01)

(58) Field of Classification Search
CPC .. H05K 5/0217; H05K 5/0247; H05K 7/1432
USPC ......................................... 361/601, 724–733
See application file for complete search history.

(56) References Cited

U.S. PATENT DOCUMENTS

| 5,761,045 A | 6/1998 | Olson et al. |
| 7,030,771 B2 | 4/2006 | Kinnard et al. |
| 2003/0081386 A1* | 5/2003 | Robillard et al. ............. 361/724 |
| 2004/0179334 A1 | 9/2004 | Kinnard et al. |
| 2013/0063901 A1* | 3/2013 | Wang ........................... 361/726 |

FOREIGN PATENT DOCUMENTS

| TW | 200640101 | 11/2006 |
| TW | M381826 | 6/2010 |

OTHER PUBLICATIONS

Office Action dated Apr. 29, 2014 from corresponding No. TW 101140378.

* cited by examiner

*Primary Examiner* — Ramon Barrera
(74) *Attorney, Agent, or Firm* — Lowe Hauptman & Ham, LLP

(57) ABSTRACT

The disclosed is a power electronic device comprising a power unit and a mounting cubicle matching with the power unit. The mounting cubicle is provided with a rail and an entrance for pushing into and pulling out of the power unit. A side of the mounting cubicle is provided with an power source and control output terminal and a signal output terminal. A side of the power unit is provided with a power source and control input terminal and a signal input terminal. The power unit is provided with a micro-switch. When the power unit moves along the rail, after the power source and control input terminal contacts with the power source and control output terminal. The signal input terminal becomes electrically connected with the signal output terminal, and the micro-switch is turned on so as to start the power unit.

20 Claims, 14 Drawing Sheets

POWER ELECTRONIC DEVICE, POWER ELECTRONIC SYSTEM AND HOT PLUG METHOD FOR POWER UNIT

CROSS-REFERENCE TO RELATED APPLICATIONS

This application claims benefits of Chinese Patent Application No. 201210364745.7, filed on Sep. 26, 2012 in the State Intellectual Property Office of China, the disclosure of which is incorporated herein by reference in its entirety.

TECHNICAL FIELD

The present disclosure relates to a power electronic device, a power electronic system and a hot plug method for a power unit.

BACKGROUND

In the conventional power electronic system, a number of IGBTs, inductors, capacitors, resistors and other components, as the major components of the power part, are installed to the cabinet separately, which means the entire power part is not modularized. Only in few power electronic systems there are a number of IGBTs or inductors, capacitors and resistors integrated into a power electronic device, namely the power part is modularized. Generally, one power electronic system includes a number of power electronic devices.

As shown in FIG. 1, in the conventional power electronic system, each power electronic device comprises a power unit 1, a number of conductive terminals 10 and a number of connection terminals 13. Power lines 14 connected to the power grid are connected to the conductive terminal 10 by screws 20, and the conductive terminals 10 are connected to the power unit 1, as a result, the power line 14 and the power unit 1 are electrically connected. The signal lines 15 are in electrical connection with the power unit 1 via the connection terminals 13. The fixed connection of the power line 14 and the signal line 15 to the power unit 1 limits the moving range of the power unit 1, as a result, there is no free plugging of the power electronic device with respect to the cabinet. If a power electronic device of the power electronic system occurs abnormal, the requirement of shutting down the entire power electronic system for maintenance or replacement would seriously affect the efficiency of the power electronic system.

Therefore, it cannot be achieved that the power electronic device is freely plugged with respect to the cabinet in the conventional power electronic system. Moreover, it cannot be achieved that the failed power electronic device is maintained or replaced in the case that other power electronic devices operate normally. In this case, it is needed to achieve an easy hot plug function.

SUMMARY

Further scope of applicability of the present disclosure will become apparent from the detailed description given hereinafter. However, it should be understood that the detailed description and specific examples, while indicating exemplary embodiments of the invention, are given by way of illustration only, since various changes and modifications within the spirit and scope of the disclosure will become apparent to those skilled in the art from the following detailed description.

According to an aspect of the invention, a power electronic device is provided, comprising a power unit and a mounting cubicle matching with the power unit which has a rail and an entrance for pushing the power unit into the mounting cubicle and pulling the power unit out of the mounting cubicle. A side of the mounting cubicle away from the entrance is provided with an power source and control output terminal and a signal output terminal. A side of the power unit facing the power source and control output terminal and the signal output terminal is provided with a power source and control input terminal and a signal input terminal. The power unit is provided with a micro-switch. A distance between the signal output terminal and the signal input terminal is larger than a distance between the power source and control output terminal and the power source and control input terminal. When operating the power unit is required to be pushing into the mounting cubicle, the power unit moves along the rail, after the power source and control input terminal of the power unit contacts with the power source and control output terminal. As the power unit is pushed continuously. The signal input terminal of the power unit becomes electrically connected with the signal output terminal, and the micro-switch is turned on so as to start the power unit. When the operating power unit is required to be pulled out of the mounting cubicle, the micro-switch is turned off so as to stop the power unit, and the power unit moves toward the entrance along the rail, and the power unit is first disconnected with the signal output terminal and then the power unit is disconnected with the power source and control output terminal.

According to another aspect of the invention, a power electronic system comprising a cabinet and at least one power unit is provided. the cabinet comprises a plurality of mounting cubicles, wherein each of the mounting cubicles is provided with a rail and an entrance for pushing in and pulling out of the power unit. A side of the mounting cubicle away from the entrance is provided with an power source and control output terminal and a signal output terminal. A side of the power unit facing the power source and control output terminal and the signal output terminal is provided with a power source and control input terminal and a signal input terminal. The power unit is provided with a micro-switch. A distance between the signal output terminal and the signal input terminal is larger than a distance between the power source and control output terminal and the power source and control input terminal. When the power unit is required, the power unit is pushed into the mounting cubicle along the rail. After the power source and control input terminal of the power unit is first in electrical connection with the power source and control output terminal, as the power unit is pushed in continuously, the signal input terminal of the power unit becomes in electrically connected with the signal output terminal, after which the micro-switch is turned on and the power unit is turned on. When the power unit is required to be pulled out, the micro-switch is turned off and the power unit is turned off. The power unit moves toward the entrance along the rail, and the power unit is first disconnected with the signal output terminal and then the power unit is disconnected with the power source and control output terminal.

According to another aspect of the invention, a hot plug method for a power unit is provided, the method comprising steps of hot plugging a power unit into a mounting cubicle and/or hot plugging the power unit out of the mounting cubicle, wherein the mounting cubicle being provided with an power source and control output terminal and a signal output terminal, and the power unit being correspondingly provided with an power source and control input terminal and a signal input terminal, and a distance between the power source and control input terminal of the power unit and the power source and control output terminal of the mounting cubicle is less than a distance between the signal input terminal of the power unit and the signal output terminal of the mounting cubicle. The step of hot plugging the power unit into the mounting cubicle comprises pushing the power unit into the mounting cubicle; moving the power unit continuously such that the power source and control input terminal of the power unit becomes electrically connected with the power source and control output terminal of the mounting cubicle; further moving the power unit into the mounting cubicle such that the signal input terminal of the power unit becomes electrically connected with the signal output terminal of the mounting cubicle; operating a micro-switch provided on the power unit to turn on the power unit. The step of hot plugging the power unit out of the mounting cubicle comprises operating the micro-switch provided on the power unit to turn off the power unit; pulling out the power unit such that the signal input terminal of the power unit is electrically disconnected with the signal output terminal of the mounting cubicle; further pulling out the power unit such that the power source and control input terminal of the power unit is electrically disconnected with the power source and control output terminal of the mounting cubicle.

BRIEF DESCRIPTION OF THE DRAWINGS

The present disclosure will become more fully understood from the detailed description given hereinafter and the accompanying drawings which are given by way of illustration only and thus are not limitative of the present disclosure.

DETAILED DESCRIPTION

Figure 1:
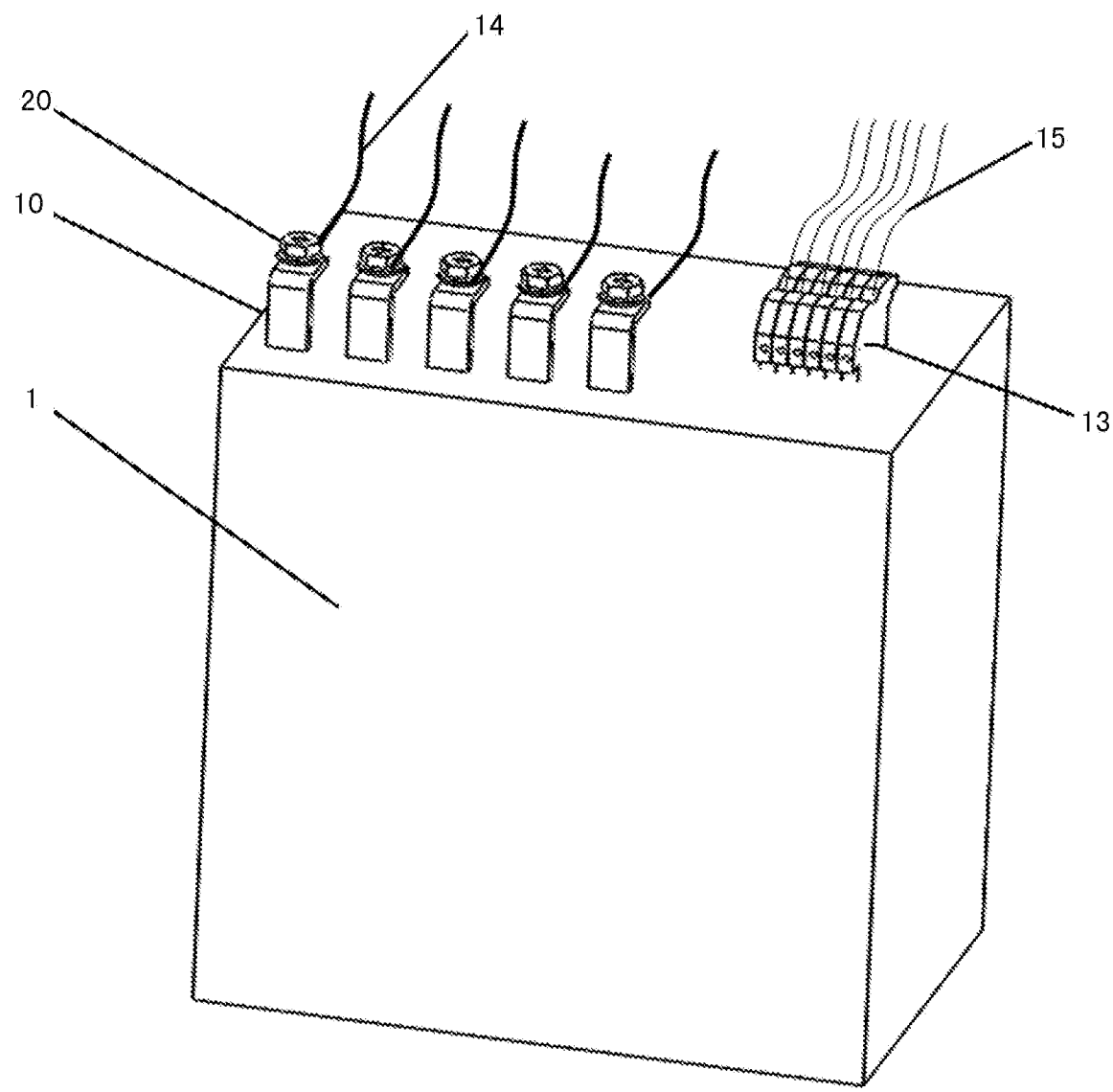
FIG. 1 is a schematic view of the power electronic device of the related art.

Several exemplary embodiments which reflect the characteristics and advantages of the present invention will be described in detail. The invention may, however, be embodied in many different forms without departing from the principles of the invention. Moreover, the following detailed description of the embodiments of the invention and the accompanying drawings are provided so that this disclosure will be thorough and complete, and should not be construed as limiting the present invention.

The above and other technical content, feature and effect of the present invention will be illustrated with reference to the detailed description of the following embodiments.

The technical idea is that, the power electronic device is used as the basis core to cooperate with the power and control output terminal and the signal output terminal fixed to the mounting cabinet, the power source and control input terminal and the signal input terminal fixed to the power unit, and the rail for the power unit to slide on. The sliding of the power unit along the rail achieves the connection or disconnection of the external current with or from the power unit, and thus the hot plug function of the power electronic device is realized.

Power Electronic Device

Referring to FIG. 2A through FIG. 7B, the shown power electronic device comprises a mounting cabinet 100, a hot plug power unit 1 for the mounting cubicle 100 and a micro-switch 5.

The shape of the mounting cubicle 100 matches that of the power unit 1, which may be a cuboid, but is not limited thereto. An entrance 130 is provided on one side of the mounting cubicle 100 (defined as a front face in this embodiment) for plugging the power unit 1 into or out of the mounting cubicle 100. A mounting beam 7 is fixed to the side away from the entrance 130 of the mounting cubicle 100 (defined as a rear side). A left rail 110 and a right rail 120 are located at two parallel edges of one side face (e.g., a side face perpendicular to the front face) of the cabinet 100. The left rail 110 and the right rail 120 are applied to support the power unit 1 and to guide the power unit 1 to slide forward and backward in the mounting cubicle 100, and thus the power unit 1 is plugged into or plugged out of the mounting cubicle 100. Alternatively, the rails can be fixed on the bottom of the mounting cubicle 100 or other positions in the mounting cubicle 100.

The number of the rails is not limited to two, for example, it may be one or three and so on.

An power source and control output terminal and the signal output terminal are fixed on the mounting beam 7 of the mounting cubicle. The signal output terminal can be the sample current signal output terminal. For example, the power source and control output terminal are the power source and control plug 2, which are electrically connected with a external power line and an external signal line. The power source and control output terminal may be divided into two plugs of a power source plug and a control plug. The power source plug is connected with the external power source line, and the control plug is connected with the external signal line. Therefore, the number of the plugs is selected according to the number of the practically makeable plugs, or is designed or selected according to the number of external signals practically required to be connected with the plugs, but not limited thereto.

The mounting beam 7 of the mounting cubicle 100 is provided with the signal output terminal, which for example may be a mechanically controlled contact 45 of a travel switch 4. The travel switch 4 comprises a body 41, a first terminal 42 and a second terminal 43 provided on the body 41, and a mechanically controlled contact 45 with one end fixed to the body 41. Wherein, the first terminal 42 and the second terminal 43 are electrically connected with signal lines respectively. The signal line for example may be a current signal line, or it may also be a voltage signal line. The signal line is a sample current signal line for example. When the travel switch 4 is in a non-working state, the first terminal 42 and the second terminal 43 are in a closed state (an electrically connected state), the sample current signal line, the first terminal 42 and the second terminal 43 form a loop, and the sample current signal does not pass through the power unit 1. When the travel switch 4 is in a working state, for example, when the power unit 1 is in contact with the mechanically controlled contact 45, the first terminal 42 and the second terminal 43 are in an open state, the sample current signal passes through the first terminal 42, the mechanically controlled contact 45 and the power unit 1. Thus, the sample current signal enters into the power unit 1 through the contact point of the mechanically controlled contact 45.

The power unit may be a power quality compensator or a static var compensator (SVC). The shape of the power unit 1 may be a rectangle, for example, but not limited thereto. The rear side of the power unit 1 (namely the side facing the mounting beam 7 of the mounting cubicle 100) is provided with a power source and control socket 3 corresponding to the electrical connection position of the power source and control output terminal. The power source and control socket 3 matches the power source and control plug 2. The combination or separation of the power source and control socket 3 and the power source and control plug 2 can realize the electrical connection or the electrical disconnection between the power source and control socket 3 and the power source and control plug 2, and between the power unit 1 and the external power line and the external signal line. In other embodiments, the power source and control plug may be divided into two plugs of a power source plug and a control plug. Accordingly, the power source and control socket are divided into a power source socket and a control socket matching the power source plug and control plug.

The rear side of the power unit 1 corresponding to the electrical connection position of the signal output terminal is further provided with a signal input terminal 9 matching with the signal output terminal, i.e., matching with the mechanically controlled contact 45 of the travel switch. That is, the contact or separation of the signal input terminal 9 and the mechanically controlled contact 45 controls the connection or disconnection between the first terminal 42 and the second terminal 43 of the travel switch 4, and thus controls the electrical connection or electrical disconnection between the signal input terminal 9 of the power unit 1 and the external signal line. Due to varying type of the travel switches, the structure of the travel switch 4 is not limited to the example shown. Any other types of travel switch may be applied as long as the change of the relative distance between the power unit 1 and the travel switch can control on/off of the travel switch so as to control the connection or disconnection between the external signal and the power unit 1.

Additionally, in the power electronic device according to other embodiments, the travel switch is not necessarily mounted on the rear side of the mounting cubicle 100. Some travel switches of some existing structure may be mounted on the lateral side of the mounting cubicle 100, and the matched signal input terminal is correspondingly provided on the lateral side of the power unit 1.

In the case that the mounting cubicle 100 is not provided with the mounting beam 7, the power source and control plug 2, the travel switch 4 can be mounted on other position at the rear side of the mounting cubicle 100, as long as they can contact and make electrically connected with the power source and control socket 3, the signal input terminal 9 on the rear side of the power unit 1.

Figure 2A:
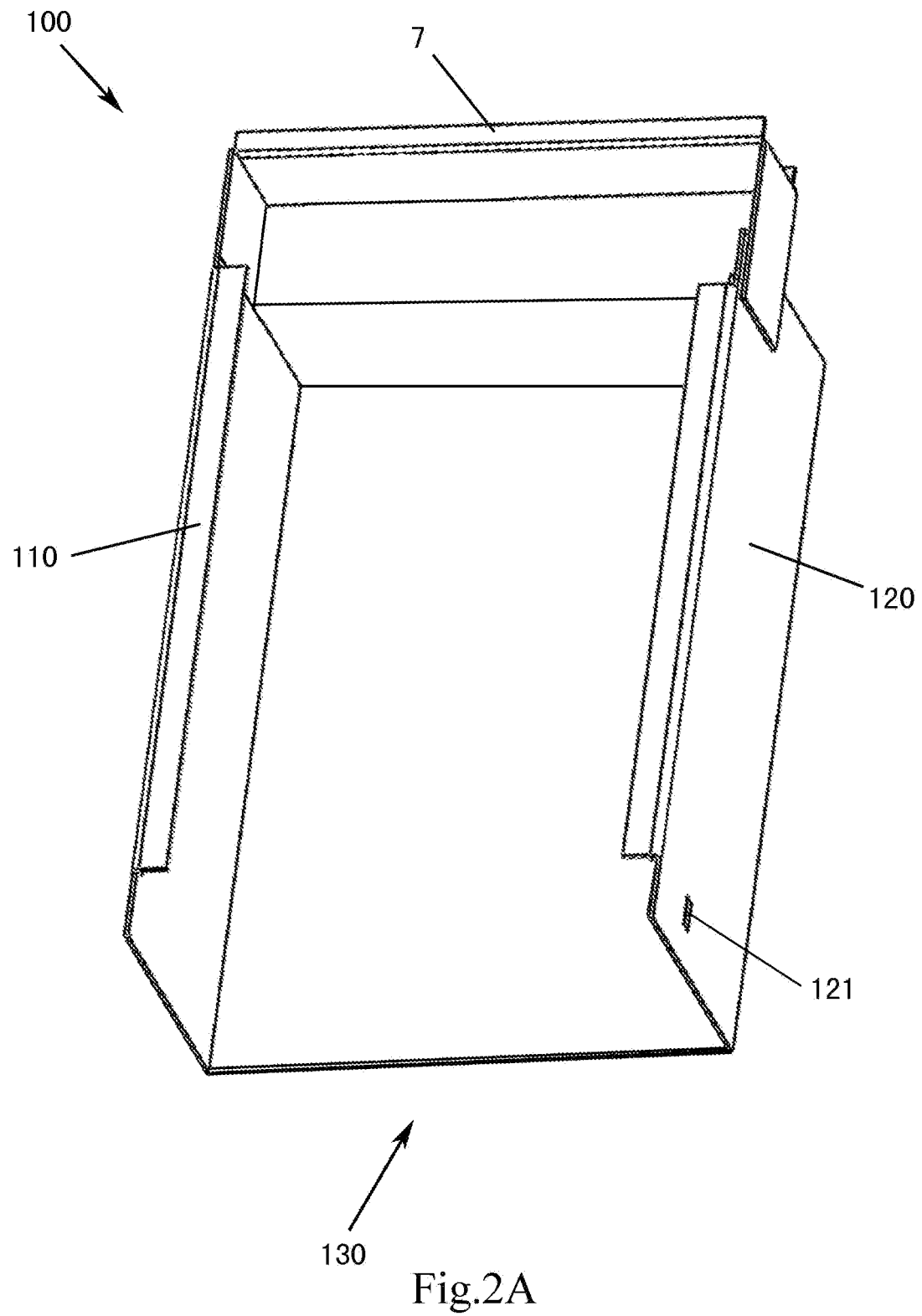
FIG. 2A is a perspective schematic top view of the cabinet of the present power electronic device.
Figure 2B:
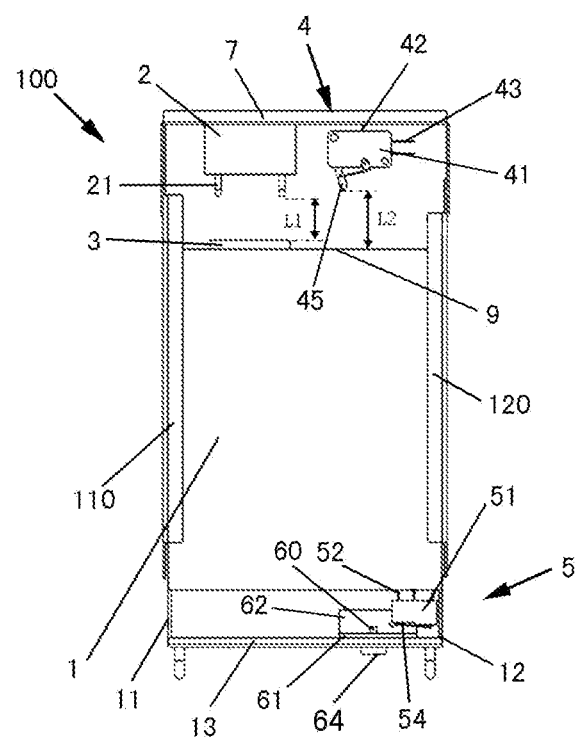
FIG. 2B is a top view of the power electronic device showing a state that there is a certain distance between the power source and control output terminal and the power source and control input terminal, according to an embodiment of the invention.

Before forming the electrical connection between the power unit 1 and the external power source line, control line and signal line, the distance for electrical connection between the power source and control socket 3 and the power source and control plug 2 is less than the distance for electrical connection between the signal input terminal 9 and the signal output terminal, wherever the socket and plug are disposed. Referring to FIG. 2B, the signal output terminal is the mechanically controlled contact 45 of the travel switch 4, the distance to achieve the electrical connection between the power source and control socket 3 and the power source and control plug 2 is the distance L1 between the power contact 21 and the power source socket 3. The distance to achieve the electrical connection between the signal input terminal 9 and the mechanically controlled contact 45 of the travel switch 4 is the distance L2 between the signal input terminal 9 and the contact 45 of the travel switch 4. As shown in FIG. 2B, the distance L1 is less than the distance L2. This design is to ensure to form the electrical connection between the power source and control socket 3 and the power source and control plug 2 earlier than between the signal input terminal 9 and the travel switch 4, during electrically connecting. At the same time, the electrical connection between the signal input terminal 9 and the travel switch 4 is formed earlier than that between the power source and control socket 3 and the power source and control plug 2, during electrically disconnecting.

In the illustrated power electronic device, the micro-switch 5 is mounted on the power unit 1 to turn off or turn on the power unit 1. In the micro-switch 5 of one embodiment, the micro-switch 5 comprises a micro-switch body 51, an output terminal 52 and a micro-motion elastic piece 54 provided on the micro-switch body 51. The output terminal 52 is electrically connected with the power unit 1, and the electrical off/on signal of the micro-switch pass through the output terminal 52 to the power unit 1. The compressed or released state of the micro-motion elastic piece 54 is corresponding to the on/off state of the micro-switch 5 respectively. It is to be noted that, in the exemplified micro-switch 5 according to the illustrated embodiment, "on" corresponds to the state of the micro-switch when the power unit is started, and "off" corresponds to the state of the micro-switch when the power unit is stopped. However, in other embodiments, the "on" and "off" states of the micro-switch 5 correspond to the stop and start of the power unit, respectively. The structure of the micro-switch is not limited to the illustrated embodiments; any other micro-switches which can start/stop the power unit 1 are applicable.

The power electronic device further comprises a control lock 6. When the micro-switch 5 starts the power unit 1 to work, the control lock 6 fixes the position of the power unit 1 relative to the mounting cubicle 100, to prevent the power unit 1 from being plugged out by mistake or to prevent other accidents from happening. The illustrated control lock 6 not only has a locking function, but also can control on/off of the micro-switch 5. The power unit 1 further comprises a left-side plate 11, a right-side plate 12 and a panel 13. The left-side plate 11 and the right-side plate 12 extend forward from the left side and the right side of the power unit 1. The panel is fixed to the front ends of the left-side plate 11 and the right-side plate 12. The panel 13 is provided with a sliding groove 131 extending along the left-right direction (perpendicular to the rail). If the power unit 1 is not provided with the panel 13, the sliding groove 131 may also be provided on the face of the power unit 1 exposed by the entrance when the power unit 1 is plugged into the mounting cubicle 100.

Figure 6:
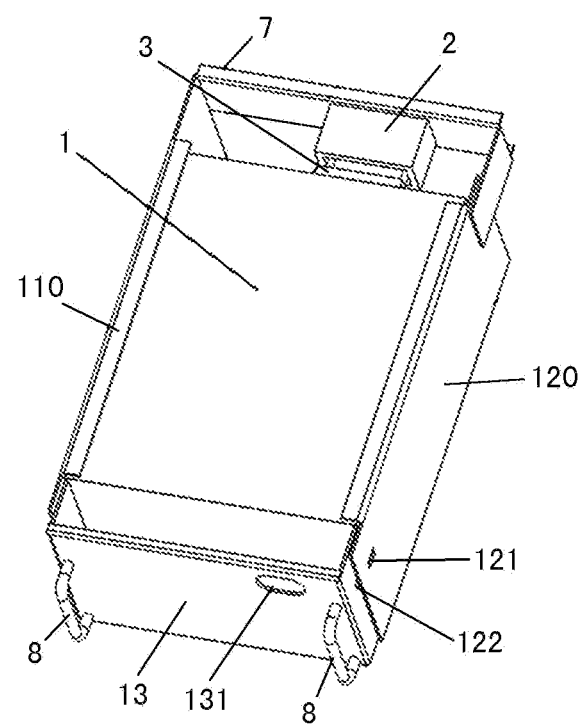
FIG. 6 is another perspective schematic view of the power electronic device with the travel switch removed, according to an embodiment of the invention.
Figure 7A:
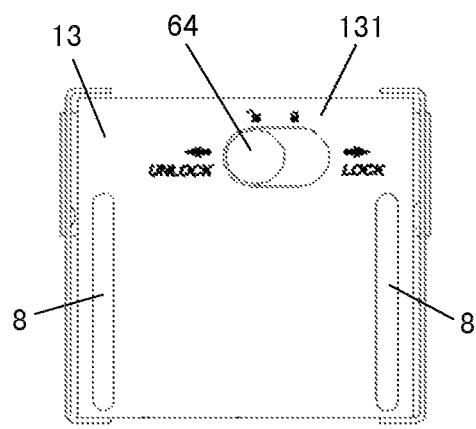
FIG. 7A is a bottom view of FIG. 4A showing the relationship between the unlocked control lock and the panel, according to an embodiment of the invention.
Figure 7B:
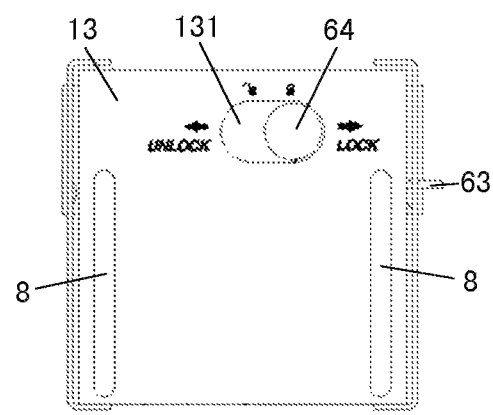
FIG. 7B is a bottom view of FIG. 5A showing the relationship between the locked control lock and the sliding groove on the panel, according to an embodiment of the invention.
Figure 8A:
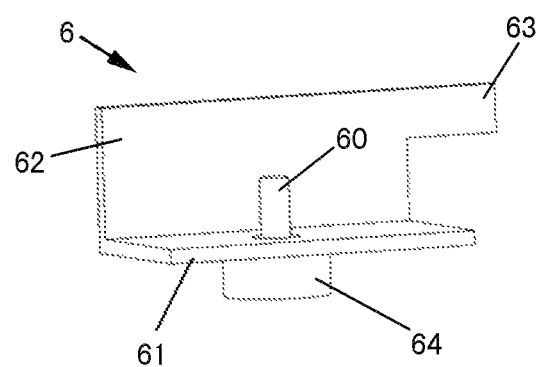
FIG. 8A is a perspective schematic view of the control lock of the power electronic device, according to an embodiment of the invention.
Figure 8B:
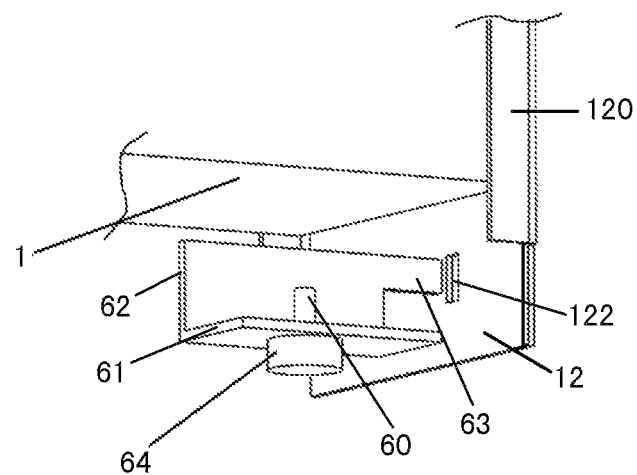
FIG. 8B is a perspective schematic view showing a state that the control lock does not lock the cabinet of the power electronic device, according to an embodiment of the invention.
Figure 8C:
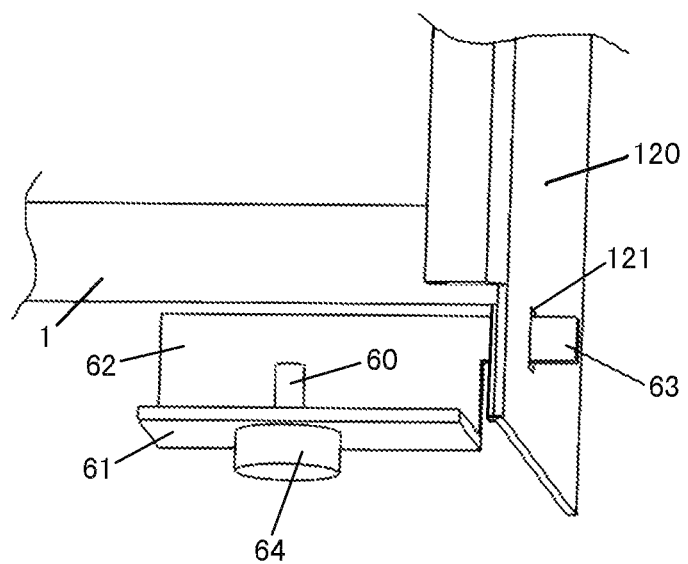
FIG. 8C is a perspective schematic view showing a state that the control lock locks the cabinet of the power electronic device, according to an embodiment of the invention.

Referring to FIG. 8A, the specific structure of a control lock 6 is illustrated as an example. The control lock 6 comprises a mechanical lock body and a mechanical sliding key 60 connecting to the mechanical lock body. The L-shaped mechanical lock body comprises a first body 61 and a second body 62 perpendicular to each other. The mechanical sliding key 60 is fixed to the first body 61. With reference to FIGS. 6 through 7B, the first body 61 is bonded to the inside of the panel 13. Corresponding to the mechanical sliding key, the panel 13 is provided with a sliding groove 131 for the mechanical sliding key 60 to slide in to drive the mechanical lock body. A lock tongue 63 protrudes from one side of the second body 62. Referring to FIG. 6, for matching the lock tongue 63, a first keyhole 121 is formed in the right side of the mounting cubicle 100, a second keyhole 122 is formed in the right-side plate 12 of the power unit 1. When the power unit 1 is plugged into place, the first keyhole 121 aligns with the second keyhole 122, the mechanical sliding key 60 moves along the sliding groove 131 and can drive the lock tongue 63 to insert into or withdraw from the first keyhole 121 defined on the mounting cubicle 100. Referring to 5B, the micro-switch 5 is provided in the power unit 1 close to the mechanical sliding key 60 to achieve the control of the micro-switch 5 at the time of the control lock 6 locking or unlocking the mounting cubicle 100 and power unit 1. When one end of the mechanical sliding key 60 slides under control, the other end of the mechanical sliding key 60 presses or releases the micro-motion elastic piece 54 of the micro-switch 5 to control the on/off of the micro-switch. In order to facilitate the motion of the mechanical sliding key 60, a holding part 64 can be provided at the outer end of the mechanical sliding key 60 extending beyond the sliding groove 131. Above mentioned is that the control lock 6 controls to turn on the micro-switch 5 and lock the power unit 1 simultaneously, or the control lock 6 controls to turn off the micro-switch and unlock the power unit 1 simultaneously. In some other embodiments, the locking or unlocking of the control lock 6 may be independent to the on/off of the micro-switch 5.

In the power electronic device mentioned herewith, two parallel handles 8 are mounted on the panel 13 of the power unit 1 to facilitate the power unit 1 to be pushed in or pulled out of the mounting cubicle 100. In order to save effort or realize automation, a designed or existing drive device can also be used to move the power unit 1.

Power Electronic System

The power electronic system introduced herewith comprises a cabinet and at least two power units. The cabinet comprises a plurality of mounting cubicles. The mounting cubicles are arranged in arrays, e.g., 1×N arrangement, M×N arrangement (wherein M and N are natural numbers) or concentric arrangement. The mounting cubicle can be designed according to the actual formation of the cabinet. The number of the mounting cubicle may be equal to or more than that of the power electronic device.

The mounting cubicle is provided with a rail and an entrance for the power unit to be pushed in and pulled out. The side of the mounting cubicle away from the entrance is provided with an power source and control output terminal and the signal output terminal. The side of the power unit facing the power source and control output terminal and signal output terminal is provided with an power source and control input terminal and a signal input terminal. The power unit is also provided with a micro-switch. The distance between the signal output terminal and signal input terminal is larger than that between the power source and control output terminal and the power source and control input terminal. When the power unit is required, the power unit is mounted to the mounting cubicle along the rails. After the electrical connection between the power source and control input terminal and the power source and control output terminal is formed first, as the power unit continues being plugged into the mounting cubicle, the signal input terminal is in connection with the signal output terminal to turn on the micro-switch and start the power unit. When the power unit in operation is required to be unplugged, firstly the micro-switch is turned off and the power unit is turned off, and the power unit moves toward the entrance along the rail. The power unit first disconnects with the signal output terminal, and then the power unit disconnects with the power source and control output terminal. Therefore, each mounting cubicle of the cabinet may be provided with a power unit. The other parts of the mounting cubicle and the power unit that can be plugged in and unplugged out of the mounting cubicle in the power electronic system is the same as that described above and the description thereof is thus omitted.

In the power electronic system described herein, each power unit is independent and dose not interfere with each other, replacement or maintenance of one power unit in power off time dose not affect the normal operation of the other power unit. Therefore, in the case that the entire power electronic system is uninterrupted, the failed power unit is hot unplugged, the repaired power unit is hot plugged, or a target power unit is selectively unplugged or plugged, thereby greatly improving the operation efficiency of the power electronic system.

Hot Plug Method for the Power Unit

According to an exemplary embodiment, the hot plug method for the power unit comprises at least one step of hot plugging the power unit into a mounting cubicle and hot-plugging the power unit out of the mounting cubicle. The mounting cubicle is provided with the power source and control output terminal and signal output terminal, and the power unit is correspondingly provided with the power source and control input terminal and signal input terminal. The distance between the power source and control input terminal of the power unit and the power source and control output terminal of the mounting cubicle is less than that between the signal input terminal of the power unit and the signal output terminal of the mounting cubicle. The hot plug-into step comprises the sequential sub-steps of: plugging the power unit into the mounting cubicle to form the electrical connection between the power source and control input terminal of the power unit and the power source and control output terminal of the mounting cubicle, and then to form the electrical connection between the signal input terminal of the power unit and the signal output terminal of the mounting cubicle; turning on a micro-switch provided on the power unit to turn on the power unit. The hot plug-out step in reverse order of the hot plug-into step sequentially comprises: turning off the micro-switch provided on the power unit to turn off the power unit; plugging the signal input terminal of the power unit out of the signal output terminal of the mounting cubicle, and then plugging the power source and control input terminal of the power unit out of the power source and control output terminal of the mounting cubicle to disconnect the electrical connection. The method will be described in detail in combination of the power electronic device or the power electronic system explained above.

The hot plug-into step comprises the following sub-steps.

Figure 3:
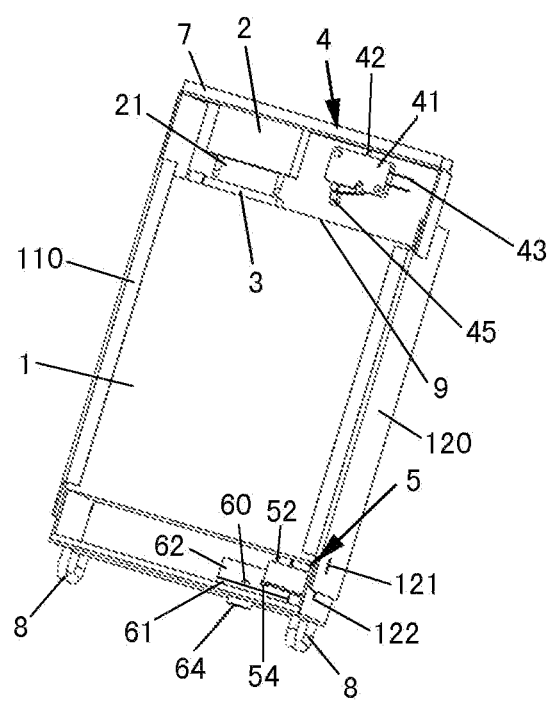
FIG. 3 a perspective schematic view of the power electronic device showing a state that the power source and control output terminal contacts the power source and control input terminal, but the signal input terminal is not in contact with control contact, according to an embodiment of the invention.

First of all, referring to FIGS. 2B and 3, the power unit 1 is pushed into the mounting cubicle 100 by holding the handles 8, the power unit 1 is moved toward the power source and control plug 2 through the entrance of the mounting cubicle 100, until the electrical connection between the power source and control socket 3 and the power source and control plug 2 is formed, thereby forming the electrical connection between the power unit 1 and the external power line, and the micro-switch is in OFF-state. When the power source and control plug 2 moves toward the power source and control socket 3, the pin of the power source and control plug 2 is in contact with the power source and control socket 3 or with the slot provided in the power source and control socket 3, the electrical connection between the power source and control plug and the external power line, signal line is formed, and thereby the electrical connection between the power unit 1 and the external power line, control line and/or signal line is formed.

Figure 4A:
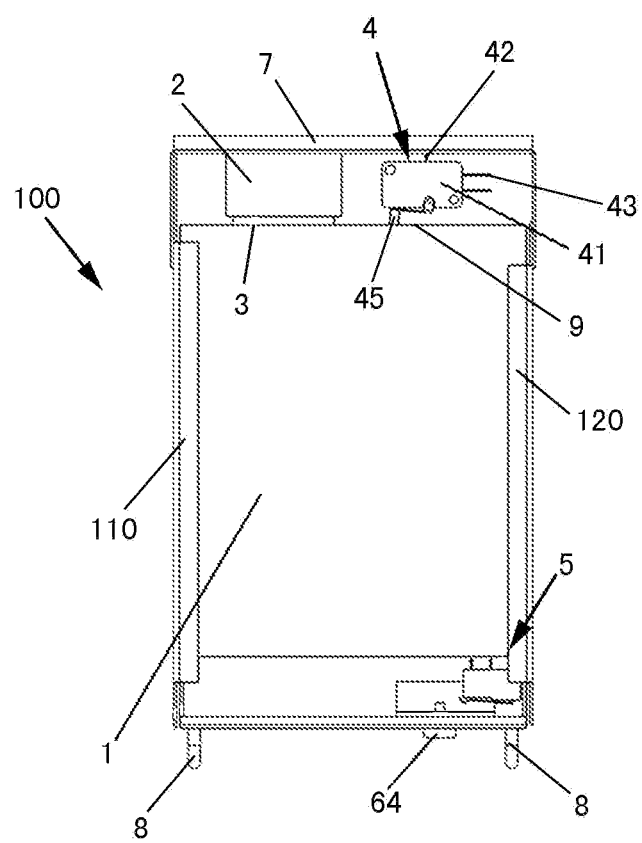
FIG. 4A is a top view of the power electronic device showing a state that the power source and control output terminal is in connection with the power source and control input terminal, and the signal input terminal is in connection with the control contact, but the control lock is not locked, according to an embodiment of the invention.
Figure 4B:
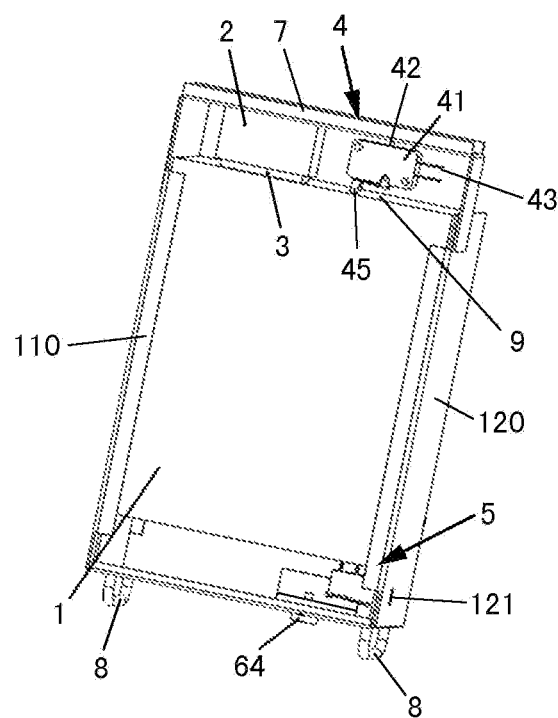
FIG. 4B is a perspective schematic view of the power electronic device showing a state that the power source and control output terminal is in connection with the power source and control input terminal, the signal input terminal is in connection with the control contact, and control lock is not locked, according to an embodiment of the invention.

Thereafter, referring to FIG. 4A, the power unit 1 is pushed along the original direction continuously, until the mechanical control contact 45 of the travel switch 4 is in contact with the signal input terminal 9 of the power unit 1, thereby form the electrical connection between the external signal line and the power unit 1. The travel switch 4 comprises a travel switch body 41, a first terminal 42, a second terminal 43 and a mechanical control contact 45. When the power unit 1 moves to contact with the mechanical control contact 45, the external signal flows through the first terminal 42, the power unit 1 and the second terminal 43, i.e., the power unit 1 is in electrical communication with the external signal.

Finally, referring to 5A, the micro-switch of the power unit is turned on to turn the power unit 1 into the normal operation state.

The hot plug-out step comprises the following sub-steps.

Figure 5A:
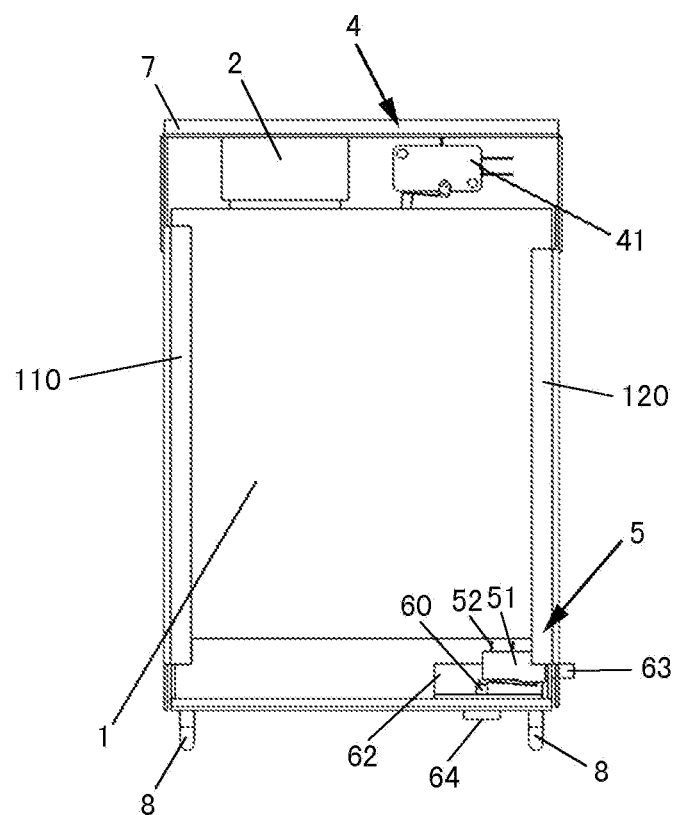
FIG. 5A is a top view of the power electronic device showing a state that the power source and control output terminal is in connection with the power source and control, the signal input terminal is in connection with the control contact, and control lock is locked, according to an embodiment of the invention.
Figure 5B:
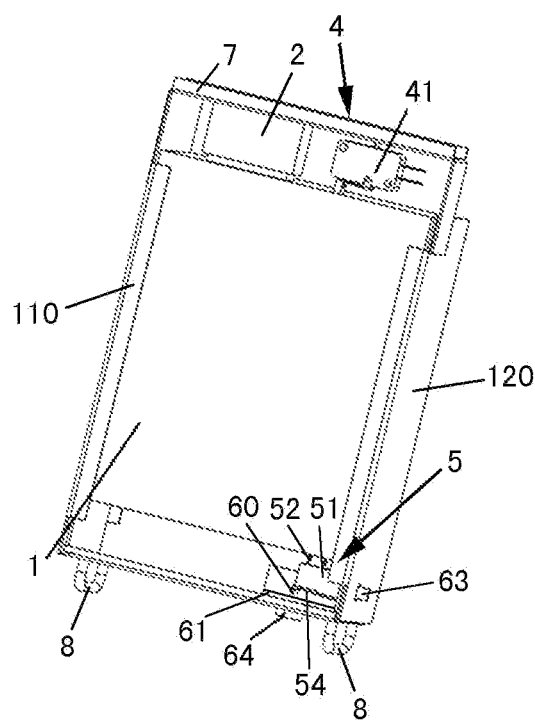
FIG. 5B is a perspective schematic view of the power electronic device showing a state that the power source and control output terminal is in connection with the power source and control input terminal, the signal input terminal is in connection with the control contact, and the control lock is locked, according to an embodiment of the invention.

First of all, referring to FIGS. 4A and 5A, when the power unit 1 is ready to be plugged out of the mounting cubicle 100, the micro-switch is turned off to turn off the power unit 1.

Thereafter, referring to FIG. 3, the power unit 1 is plugged outward (far away from the power source and control plug) through the entrance of the mounting cubicle 100, the mechanical control contact 45 of the travel switch 4 moves away from the signal input terminal 9 of the power unit 1, thereby disconnecting the external signal line with the power unit 1.

Finally, referring to FIG. 2B, the power unit 1 further moves away from the power source and control plug 2 until the power source and control socket 3 disconnects with the power source and control plug 2, and thus the power source and control socket 3 disconnects with the power source and control plug 2.

During the hot plug-into or the hot plug-out step, the micro-switch is turned on/off under the control of the control lock. In one embodiment, the control lock 6 comprises the mechanical lock body and the mechanical sliding key 60 connecting therewith. The mechanical sliding key 60 moves along the left-right direction and contacts with or separates from the micro-motion elastic piece 54 of the micro-switch 5 to press or release the micro-motion elastic piece 54, thereby turning on/off the micro-switch 5 under control. To ensure the moving direction of the mechanical sliding key 60 without offset, a sliding groove 131 may be defined on the panel 13 of the mounting cubicle 100, the outer end of the mechanical sliding key 60 extends out of the sliding groove 131 to guide the sliding. In addition, the holding part 64 may be provided at the outer end of the mechanical sliding key 60 to facilitate holding. The lock tongue 63 projects from one side of the mechanical lock body. At this time, the first keyhole 121 is provided in the mounting cubicle 100, e.g., in the right-side plate 12 of the mounting cubicle 100. The control lock 6 turns on the micro-switch 5 and locks the power unit 1 to the mounting cubicle 100 to prevent the power unit 1 in the live operation from accidentally departing from the mounting cubicle 100. The specific operation process is as follow: the holding part 64 moves rightward along the sliding groove 131, and thus the mechanical sliding key 60 moves rightward. When the inner part of the mechanical sliding key 60 presses the micro-motion elastic piece 54 of the micro-switch 5 to turn on the micro-switch 5, the electrical signal of the closed micro-switch 5 is transmitted to the power unit 1 through the output terminal 52, and the turned-on power unit is in the operation state. At the same time, the lock tongue 63 provided on the second body 62 moves rightward accordingly; when the holding part 64 moves rightward until the micro-switch 5 is turned on (the power unit 1 turns on), the lock tongue 63 inserts into the first keyhole 121 through the second keyhole 122, thereby locking the power unit 1 to the mounting cubicle 100 and preventing the power unit in operation state from dropping from the mounting cubicle 100. Conversely, the holding part 64 is pushed leftward along the sliding groove 131 until the micro-switch is turned off, and the power unit 1 is unlocked from the mounting cubicle 100 accordingly.

One or more of exemplary embodiments of the invention provide at least one or more of the following advantageous effects.

The mounting cubicle is provided with the rail and the entrance. The mounting cubicle is provided with the power source and control output terminal in electrical connection with an external power line and the signal output terminal in electrical connection with an external signal line, and the power unit is provided with the power source and control input terminal and the signal input terminal matching the power source and control output terminal and the signal output terminal. Thereby, in the power electronic device of the present disclosure, the power unit can be inserted into and withdrawn from the mounting cubicle along the rail without the limitation of the external power line or the signal line. When the power unit is plugged into the mounting cubicle, the power source and control input terminal is in electrical connection with the power source and control output terminal, the signal input terminal is in electrical connection with the signal output terminal, thereby achieving the electrical connection between the power unit and the external power line and between the power unit and the external signal line. When the power unit is plugged out of the mounting cubicle, the power unit electrically is disconnected with the external power line and the external signal line. By the aid of the micro-switch of the power unit, the present power electronic in the live state can be turned on or turned off. Therefore, the hot plug function with respect to the mounting cubicle can be realized by the present power electronic device, resulting in easy assembling, disassembling and maintenance, safety operation, and convenience.

The present power electronic system comprises the cabinet having a plurality of mounting cubicles and a plurality of power units, and each mounting cubicle is provided with a power unit. When it is required for maintenance or change a failure power electronic device, the power electronic device can be directly pulled out of the mounting cubicle after being turned off by switching off the micro-switch of the power unit, without turning off the entire power system and affecting normal operation of the other power units. Meanwhile, the repaired power unit can be hot plugged into the power system in live state, thereby greatly improving the operation efficiency of the present power system.

The hot plug method for the present power unit comprises the step of hot plugging a power unit into the mounting cubicle and the step of hot plugging a power unit out of the mounting cubicle. The hot plugging of the power unit into the mounting cubicle comprises the following sub-steps: forming the electrical connection between the power source and control output terminal of the mounting cubicle and the power source and control input terminal of the power unit and subsequent electrical connection between the signal output terminal of the mounting cubicle and the signal input terminal of the power unit, and closing the micro-switch. The hot plugging of the power unit out of the mounting cubicle is reverse in sequent to the hot plugging of the power unit into the mounting cubicle, and the hot plugging of the power unit out of the mounting cubicle comprises the following sub-steps: switching off the micro-switch, the signal output terminal and the signal input terminal being electrically disconnected, and the power source and control output terminal and the power source and control input terminal being electrically disconnected. As such, the power electronic system can be reliably hot plugged, and the negative effect on the entire power system and other power electronic devices can be avoided.

And it should be noted that the above embodiments is only illustrated for describing the technical solution of the invention and not restrictive, and although the invention is described in detail by referring to the aforesaid embodiments, the skilled in the art should understand that the aforesaid embodiments can be modified and portions of the technical features therein may be equally changed, which does not depart from the spirit and scope of the technical solution of the embodiments of the invention.

What is claimed is:

1. A power electronic device comprising:
a power unit; and
a mounting cubicle matching with the power unit, which has a rail and an entrance for pushing the power unit into the mounting cubicle and pulling the power unit out of the mounting cubicle,
wherein a side of the mounting cubicle away from the entrance is provided with a power source and control output terminal and a signal output terminal, a side of the power unit facing the power source and control output terminal and the signal output terminal is provided with a power source and control input terminal and a signal input terminal, and the power unit is provided with a micro-switch, a distance between the signal output terminal and the signal input terminal is larger than a distance between the power source and control output terminal and the power source and control input terminal,
when the power unit is required to be pushing into the mounting cubicle, the power unit moves along the rail, after the power source and control input terminal of the power unit contacts with the power source and control output terminal and forms electrical connection, as the power unit is pushed continuously, the signal input terminal of the power unit becomes electrically connected with the signal output terminal, and the micro-switch is turned on so as to start the power unit,
when the operating power unit is required to be pulled out of the mounting cubicle, the micro-switch is turned off so as to stop the power unit, and the power unit moves toward the entrance along the rail, the power unit is first disconnected with the signal output terminal and then the power unit is disconnected with the power source and control output terminal.

2. The power electronic device of claim 1, wherein the power unit is a cuboid, and the mounting cubicle matches the size of the power unit.

3. The power electronic device of claim 2, wherein a pair of rails are located at two parallel edges of one side of the mounting cubicle.

4. The power electronic device of claim 1, wherein the power source and control output terminal is a power source and control plug connected to a power line, which is provided on the side of the mounting cubicle away from the entrance, and the power source and control input terminal is a power source socket, which is provided on the side of the power unit close to the power source and control plug.

5. The power electronic device of claim 1, wherein the signal output terminal is a mechanical control contact of a travel switch including a first terminal and a second terminal, and the first and second terminals are in connection with an external signal line and fixed to the mounting cubicle, and
when the mechanical control contact is in contact with the signal input terminal, signal on the external signal line is transmitted into the signal input terminal through the first terminal and the mechanical control contact.

6. The power electronic device of claim 1, wherein the power unit is provided with a control lock having a lock tongue, and the mounting cubicle is provided with a keyhole, through which the lock tongue is inserted or withdrawn.

7. The power electronic device of claim 1, wherein the power unit is provided with a control lock, the turning on/off of the micro-switch is controlled by locking or unlocking the control lock.

8. The power electronic device of claim 7, wherein a keyhole is defined in the mounting cubicle corresponding to the control lock, the power unit is provided with a sliding groove, the control lock has a mechanical sliding key and a mechanical lock body, wherein a lock tongue protrudes from a side of the mechanical lock body, the mechanical lock body is connected with the mechanical sliding key, and the mechanical sliding key is in lock connection with the sliding groove, and the mechanical sliding key is operable to move along the sliding groove so as to make the lock tongue insert into or withdraw from the keyhole in the mounting cubicle.

9. The power electronic device of claim 8, wherein the micro-switch has a micro-motion elastic piece, and the sliding groove is provided on a side of the power unit exposed by the entrance when the power unit is pushed into the mounting cubicle,
the micro-switch is provided inside the power unit close to the mechanical sliding key, and the mechanical sliding key is operable to slide to lock the control lock and press the micro-motion elastic piece of the micro-switch, or unlock the control lock and release the micro-motion elastic piece of the micro-switch.

10. The power electronic device of claim 6, wherein a side of the power unit provided with the control lock has two handles in parallel.

11. The power electronic device of claim 1, wherein the power unit is a power quality compensator or a static var compensator (SVC), and the signal output terminal is a sample current signal output terminal.

12. A power electronic system comprising a cabinet and at least one power unit, the cabinet comprising a plurality of mounting cubicles, wherein
    each of the mounting cubicles is provided with a rail and an entrance for pushing the power unit into the mounting cubicle and pulling the power unit out of the mounting cubicle,
    a side of the mounting cubicle away from the entrance is provided with an power source and control output terminal and a signal output terminal,
    a side of the power unit facing the power source and control output terminal and the signal output terminal is provided with a power source and control input terminal and a signal input terminal, and
    the power unit is provided with a micro-switch,
    a distance between the signal output terminal and the signal input terminal is larger than a distance between the power source and control output terminal and the power source and control input terminal,
    when the power unit is required to be pushing into the mounting cubicle, the power unit moves along the rail, after the power source and control input terminal of the power unit contacts with the power source and control output terminal and forms electrical connection, as the power unit is pushed continuously, the signal input terminal of the power unit becomes electrically connected with the signal output terminal, and the micro-switch is turned on so as to start the power unit,
    when the operating power unit is required to be pulled out of the mounting cubicle, the micro-switch is turned off so as to stop the power unit, and the power unit moves toward the entrance along the rail, the power unit is first disconnected with the signal output terminal and then the power unit is disconnected with the power source and control output terminal.

13. The power electronic system of claim 12, wherein the mounting cubicles are arranged in arrays.

14. The power electronic system of claim 12, wherein the signal output terminal is a mechanical control contact of a travel switch including a first terminal and a second terminal, the first terminal being connected with a signal line, and
    when the mechanical control contact is in contact with the signal input terminal, signal on the signal line is transmitted into the signal input terminal through the first terminal and the mechanical control contact.

15. The power electronic system of claim 12, wherein the power source and control output terminal is a power source and control plug connected to a power line, which is provided on the side of the mounting cubicle away from the entrance, and the power source and control input terminal is a power source and control socket, which is provided on the side of the power unit close to the power source and control plug.

16. A hot plug method for a power unit, comprising at least one step of hot plugging a power unit into a mounting cubicle and hot plugging the power unit out of the mounting cubicle, wherein
    the mounting cubicle is provided with a power source and control output terminal and a signal output terminal,
    the power unit is correspondingly provided with a power source and control input terminal and a signal input terminal,
    a distance between the power source and control input terminal of the power unit and the power source and control output terminal of the mounting cubicle is less than a distance between the signal input terminal of the power unit and the signal output terminal of the mounting cubicle,
    the step of hot plugging the power unit into the mounting cubicle comprises:
    pushing the power unit into the mounting cubicle;
    moving the power unit continuously such that the power source and control input terminal of the power unit becomes electrically connected with the power source and control output terminal of the mounting cubicle;
    further moving the power unit into the mounting cubicle such that the signal input terminal of the power unit becomes electrically connected with the signal output terminal of the mounting cubicle;
    operating a micro-switch provided on the power unit to turn on the power unit;
    the step of hot plugging the power unit out of the mounting cubicle comprises:
    operating the micro-switch provided on the power unit to turn off the power unit;
    pulling out the power unit such that the signal input terminal of the power unit is electrically disconnected with the signal output terminal of the mounting cubicle;
    further pulling out the power unit such that the power source and control input terminal of the power unit is electrically disconnected with the power source and control output terminal of the mounting cubicle.

17. The hot plug method of claim 16, wherein in the step of hot plugging the power unit into the mounting cubicle or hot plugging the power unit out of the mounting cubicle, the micro switch is controlled by locking or unlocking a control lock mounted on the power unit.

18. The hot plug method of claim 17, wherein a keyhole of the mounting cubicle corresponds to the control lock, and the operations that the control lock is inserted into the keyhole and the control lock is withdrawn from the keyhole correspond to the locking and unlocking of the control lock respectively.

19. The hot plug method of claim 16, wherein the signal output terminal of the mounting cubicle employs a mechanical control contact of a travel switch, and a first terminal of the travel switch is connected to an external signal line and fixed to the mounting cubicle.

20. The hot plug method of claim 16, wherein the power source and control output terminal is a power source and control plug connected to a power line, and the power source and control plug is mounted on the mounting cubicle, the power source and control input terminal is a power source and control socket, and the power source and control socket is mounted on the power unit.

* * * * *